(12) United States Patent
Jang et al.

(10) Patent No.: US 12,190,769 B2
(45) Date of Patent: Jan. 7, 2025

(54) DISPLAY APPARATUS

(71) Applicant: LG Display Co., Ltd., Seoul (KR)

(72) Inventors: YoungIn Jang, Paju-si (KR); Subin Kim, Paju-si (KR); KyungYun Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/356,465

(22) Filed: Jul. 21, 2023

(65) Prior Publication Data

US 2024/0038118 A1 Feb. 1, 2024

(30) Foreign Application Priority Data

Jul. 29, 2022 (KR) .................. 10-2022-0094643

(51) Int. Cl.
*G09G 3/20* (2006.01)

(52) U.S. Cl.
CPC ....... *G09G 3/20* (2013.01); *G09G 2310/0267* (2013.01); *G09G 2310/0291* (2013.01); *G09G 2310/08* (2013.01)

(58) Field of Classification Search
CPC ........ G09G 3/20; G09G 3/006; G09G 3/3266; G09G 3/3233; G09G 3/32; G09G 2300/0426; G09G 2300/0408; G09G 2310/0267; G09G 2310/0291; G09G 2310/08; G09G 2310/0251; G09G 2310/0286; G09G 2380/10; G11C 19/28
See application file for complete search history.

(56) References Cited

U.S. PATENT DOCUMENTS

| | | | | |
|---|---|---|---|---|
| 9,704,429 B2* | 7/2017 | Seo | ...................... | G09G 3/2085 |
| 11,308,834 B2* | 4/2022 | Zhu | ........................ | G09G 3/20 |
| 11,361,695 B2* | 6/2022 | Zhu | ........................ | G09G 3/20 |
| 2017/0117341 A1* | 4/2017 | Chen | .................... | H10K 59/123 |
| 2017/0345373 A1* | 11/2017 | Kang | .................. | G09G 3/3233 |
| 2018/0188579 A1* | 7/2018 | Jeong | ............... | G02F 1/133345 |
| 2020/0159054 A1* | 5/2020 | Jeong | ...................... | G09G 3/32 |
| 2021/0201818 A1* | 7/2021 | Jang | ...................... | H01L 27/124 |
| 2021/0202675 A1* | 7/2021 | Jang | ...................... | H01L 25/167 |
| 2022/0093036 A1* | 3/2022 | Im | ...................... | H01L 23/49838 |
| 2022/0130328 A1* | 4/2022 | Shin | ..................... | G09G 3/3225 |
| 2022/0190093 A1* | 6/2022 | No | ........................ | G09G 3/3607 |

FOREIGN PATENT DOCUMENTS

| KR | 20080062264 A | 7/2008 |
|---|---|---|
| KR | 20210086309 A | 7/2021 |

\* cited by examiner

*Primary Examiner* — David Tung
(74) *Attorney, Agent, or Firm* — Seed IP Law Group LLP

(57) ABSTRACT

A display apparatus can include a display panel in which pixels, first to gth gate lines, and data lines are provided (where g is a natural number), and link lines provided on a rear surface of the display panel and connected to the data lines provided on a front surface of the display panel. In a display area including the pixels in the front surface, a first stage to an mth stage generating gate signals to be supplied to the first gate line to the gth gate line are provided (where m is a natural number less than or equal to g). A first monitoring line through which a first monitoring signal is output is further connected to the first stage, and the first monitoring line extends to the rear surface through a lateral surface of the display panel.

20 Claims, 10 Drawing Sheets

DISPLAY APPARATUS

CROSS-REFERENCE TO RELATED APPLICATIONS

This application claims the benefit of the Korean Patent Application No. 10-2022-0094643 filed on Jul. 29, 2022, which is hereby incorporated by reference as if fully set forth herein.

BACKGROUND

Technical Field

The present disclosure relates to a display apparatus.

Description of the Related Art

A display apparatus is mounted on electronic products such as televisions, monitors, notebook computers, smart phones, tablet computers, electronic pads, wearable devices, watch phones, portable information devices, navigation devices, or vehicle control display apparatus, and used as a display screen displaying images.

A display apparatus includes a display panel including pixels, a data driver supplying a data voltage to a data line, and a gate driver supplying a gate signal to a gate line.

A non-display area in which an image is not output is provided at a border or an edge of a display panel.

Recently, in order to increase the immersion of a user, a width of a non-display area has been progressively reduced, and a display panel including almost no non-display area has been proposed.

BRIEF SUMMARY

In a process of manufacturing a display panel with almost no non-display area, it may be determined whether a gate signal is normally output from a gate driver. However, after a display panel with little to no non-display area is manufactured, it cannot be determined or is difficult to determine whether a gate signal is normally output from a gate driver. Accordingly, the inventor of the present disclosure has invented a display apparatus in which it is possible to determine whether a gate signal is normally output from a gate driver even after a display panel with almost no non-display area is manufactured.

Accordingly, the present disclosure is directed to providing a display apparatus that substantially obviates one or more problems due to limitations and disadvantages of the related art.

An aspect of the present disclosure is directed to providing a display apparatus in which a monitoring line is connected to at least one stage among stages configuring a gate driver, and the monitoring line extends to a rear surface through a lateral surface of a display panel.

Another aspect of the present disclosure is directed to providing a display apparatus in which a monitoring line extends in a direction different from that of a gate line.

Another aspect of the present disclosure is directed to providing a display apparatus in which a monitoring pad provided on a rear surface is connected to a monitoring line.

Another aspect of the present disclosure is directed to providing a display apparatus in which a gate driver is provided in a display area.

Additional advantages and features of the disclosure will be set forth in part in the description which follows and in part will become apparent to those having ordinary skill in the art upon examination of the following or may be learned from practice of the disclosure. The technical features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a display panel in which pixels, first to gth gate lines, and data lines are provided (where g is a natural number), and link lines provided on a rear surface of the display panel and connected to the data lines provided on a front surface of the display panel, wherein in a display area including the pixels in the front surface, a first stage to an mth stage generating gate signals to be supplied to the first gate line to the gth gate line are provided (where m is a natural number less than or equal to g), a first monitoring line through which a first monitoring signal is output is further connected to the first stage, and the first monitoring line extends to the rear surface through a lateral surface of the display panel.

It is to be understood that both the foregoing general description and the following detailed description of the present disclosure are example and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
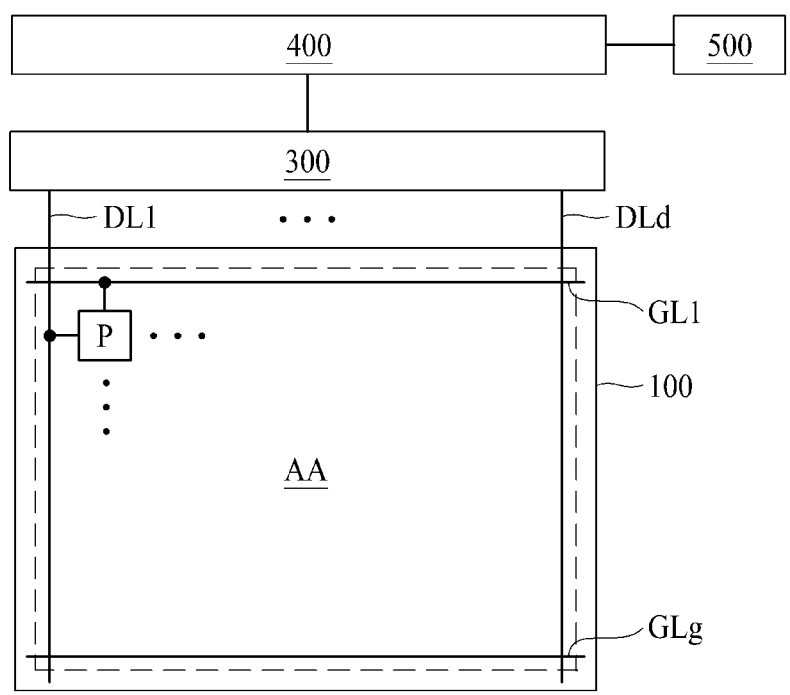
FIG. 1 is an example diagram illustrating a display apparatus according to an embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present disclosure are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be provided between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "provided," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
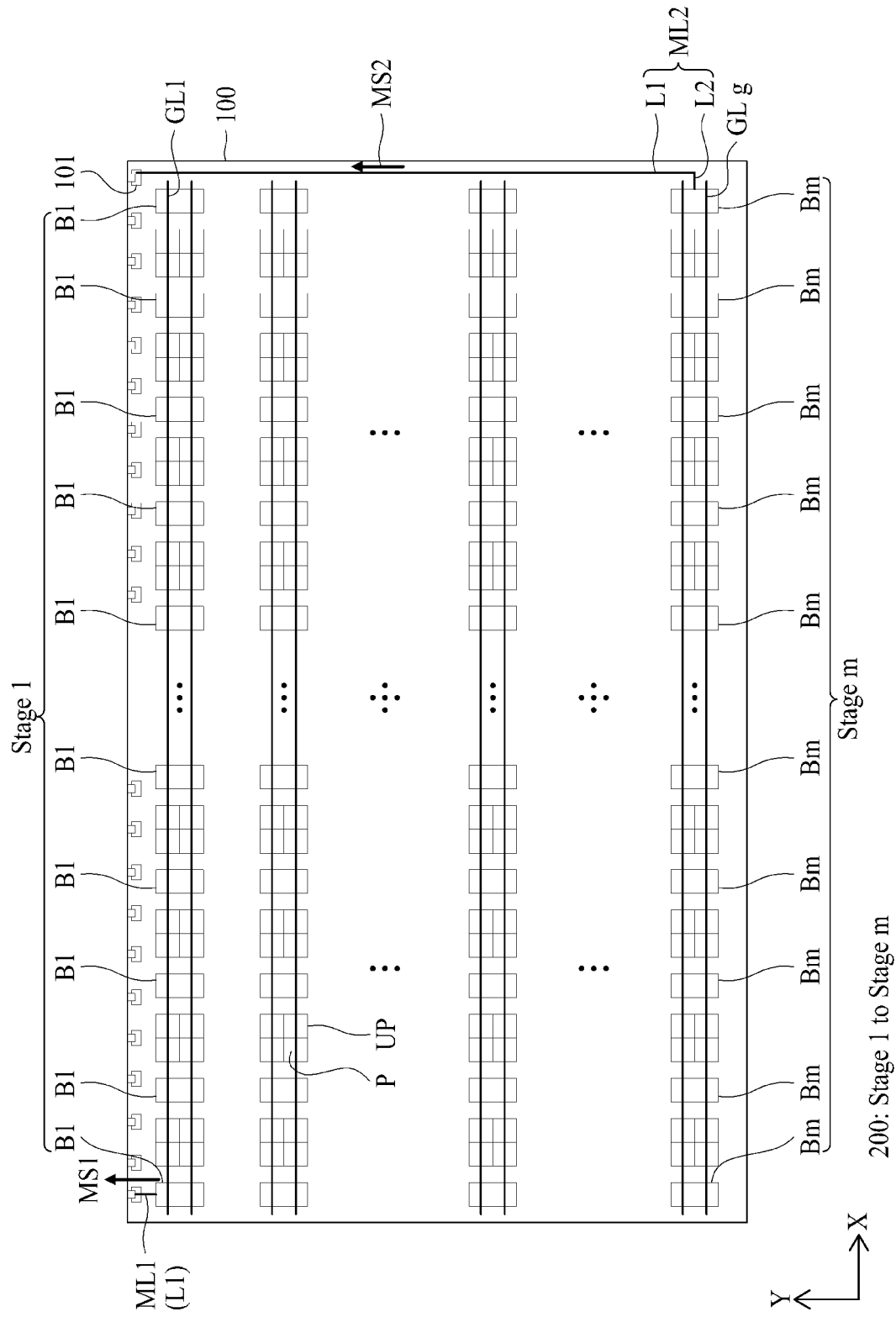
FIG. 2 is a plan view illustrating a display panel illustrated in FIG. 1.
Figure 3:
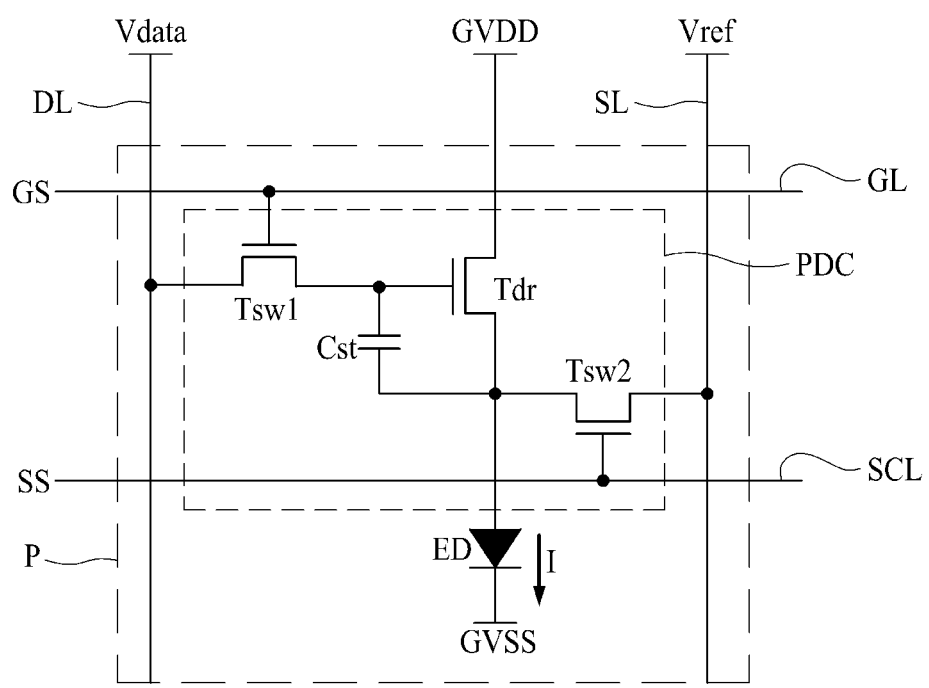
FIG. 3 is an example diagram illustrating a structure of a pixel illustrated in FIG. 1.

FIG. 1 is an example diagram illustrating a display apparatus according to an embodiment of the present disclosure, FIG. 2 is a plan view illustrating a display panel illustrated in FIG. 1, and FIG. 3 is an example diagram illustrating a structure of a pixel illustrated in FIG. 1.

A display apparatus according to an embodiment of the present disclosure may be an electronic device such as a notebook computer, a television, a monitor, a smart phone, a tablet PC, and an automotive display apparatus, or may be included in an electronic device.

The display apparatus according to an embodiment of the present disclosure, as illustrated in FIGS. 1 and 2, may include a display panel 100 which includes a display area AA displaying an image, a gate driver 200 which supplies a gate signal GS to a plurality of gate lines GL1 to GLg provided in the display area AA of the display panel 100, a data driver 300 which supplies data voltages to a plurality of data lines DL1 to DLd provided in the display panel 100, a controller 400 which controls driving of the gate driver 200 and the data driver 300, and a power supply which supplies power to the controller, the gate driver, the data driver, and the light emitting display panel.

Particularly, in the display apparatus according to the embodiment of the present disclosure, stages included in the gate driver 200 may be provided in the display area AA. Accordingly, the display panel 100 having no or almost no non-display area surrounding the display area AA may be implemented. Therefore, in FIG. 1, the non-display area is not displayed outside the display area AA.

First, pixels P displaying an image may be provided in the display area AA of the display panel 100.

As described above, because the gate driver 200 connected to the gate lines GL1 to GLg may be provided in the display area AA, the non-display area for the gate driver 200 is may be omitted. Accordingly, a width of the non-display area may be reduced compared to the related art, or the non-display area may be omitted.

The gate lines GL1 to GLg, the data lines DL1 to DLd, and the pixels P may be provided in the display area AA. Accordingly, the display area 120 may display an image. Here, g and d may each be a natural number.

The pixel P included in the display panel 100, as illustrated in FIG. 3, may include a pixel driving circuit PDC which includes a switching transistor Tsw1, a storage capacitor Cst, a driving transistor Tdr, and a sensing transistor Tsw2, and an emission unit or emission device which includes a light emitting device ED.

A structure of the pixel P included in the display panel 100 is not limited to a structure illustrated in FIG. 3. Accordingly, a structure of the pixel P may be changed to various shapes.

The data driver 300 may supply data voltages to the data lines DL1 to DLd.

The controller 400 may realign input image data transferred from an external system by using a timing synchronization signal transferred from the external system and may generate a data control signal DCS which is to be supplied to the data driver 300 and a gate control signal GCS which is to be supplied to the gate driver 200.

To this end, the controller 400 may include a data aligner which realigns input image data to generate image data Data and supplies the image data Data to the data driver 300, a control signal generator which generates the gate control signal GCS and the data control signal DCS by using the timing synchronization signal, an input unit or circuit which receives the timing synchronization signal and the input image data transferred from the external system and respectively transfers the timing synchronization signal and the input video data to the data aligner and the control signal generator, and an output unit or circuit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, image information, and letter information over a communication network and may transfer the received image information to the controller 400. In this case, the image information may be the input image data.

The power supply 500 may generate various powers and may supply the generated powers to the controller 400, the gate driver 200, the data driver 300, and the display panel 100.

Finally, the gate driver 200 may supply gate pulses to the gate lines GL1 to GLg. When the gate pulse generated by the gate driver 200 is supplied to the gate of the switching transistor Tsw1 included in the pixel P, the switching transistor Tsw1 may be turned on. When the switching transistor Tsw1 is turned on, a data voltage supplied through a data line may be supplied to the pixel P. When a gate off signal generated by the gate driver 200 is supplied to the switching transistor Tsw1, the switching transistor Tsw1 may be turned off. When the switching transistor Tsw1 is turned off, a data voltage may not be supplied to the pixel P any longer. The gate signal GS supplied to the gate line GL may include the gate pulse and the gate off signal.

The gate driver 200 may include stages Stage 1 to Stage m, and the stages Stage 1 to Stage m may be connected to gate lines GL1 to GLg. The stages Stage 1 to Stage m may be provided in the display panel 100, and particularly, may be provided in the display area AA. Here, m may be a natural number less than or equal to g.

The gate driver 200 may include stages Stage 1 to Stage m for sequentially outputting gate pulses to the gate lines GL1 to GLg. Each of the stages Stage 1 to Stage m may include stage transistors. In this case, the transistors included in the stages Stage 1 to Stage m may be provided in a display area AA of a front surface of the display panel 100.

For example, as illustrated in FIG. 2, a first stage Stage 1 configuring the gate driver 200 may include first branch circuit units B1, and each of the mth branch circuit units B1 may include at least one transistor included in the first stage Stage 1. Moreover, an mth stage Stage m configuring the gate driver 200 may include mth branch circuit units Bm, and each of the mth branch circuit units Bm may include at least one transistor included in the mth stage Stage m.

Each of the stages includes branch circuit units, and at least one transistor is provided in each of the branch circuit units. Hereinafter, for convenience of description, the present disclosure will be described by using the first branch circuit units B1 configuring the first stage Stage 1 or the mth branch circuit units Bm configuring the mth stage Stage m. Accordingly, descriptions of the first branch circuit units B1 or the mth branch circuit units Bm may be identically applied to branch circuit units included in second to m−1th stages.

The first branch circuit units B1, for example, as illustrated in FIG. 2, may be provided between unit pixels UP configured with four pixels P arranged along a gate line GL. The unit pixel UP, for example, may include a white pixel W, a red pixel R, a green pixel G, and a blue pixel B.

However, the first branch circuit units B1 may be provided between two pixels P adjacent to each other along a gate line. That is, the first branch circuit units B1 may be provided between the pixels P in various shapes.

The term "unit" as used herein includes circuits, structures, and integrated circuits components, such as semiconductors.

In this case, each of the first stage Stage 1 to the mth stage Stage m may be connected to at least one gate line. That is, each of the first stage Stage 1 to the mth stage Stage m may output gate pulses to one gate line, or may output gate pulses to two gate lines, or may output gate pulses to three or more gate lines.

Figure 4:
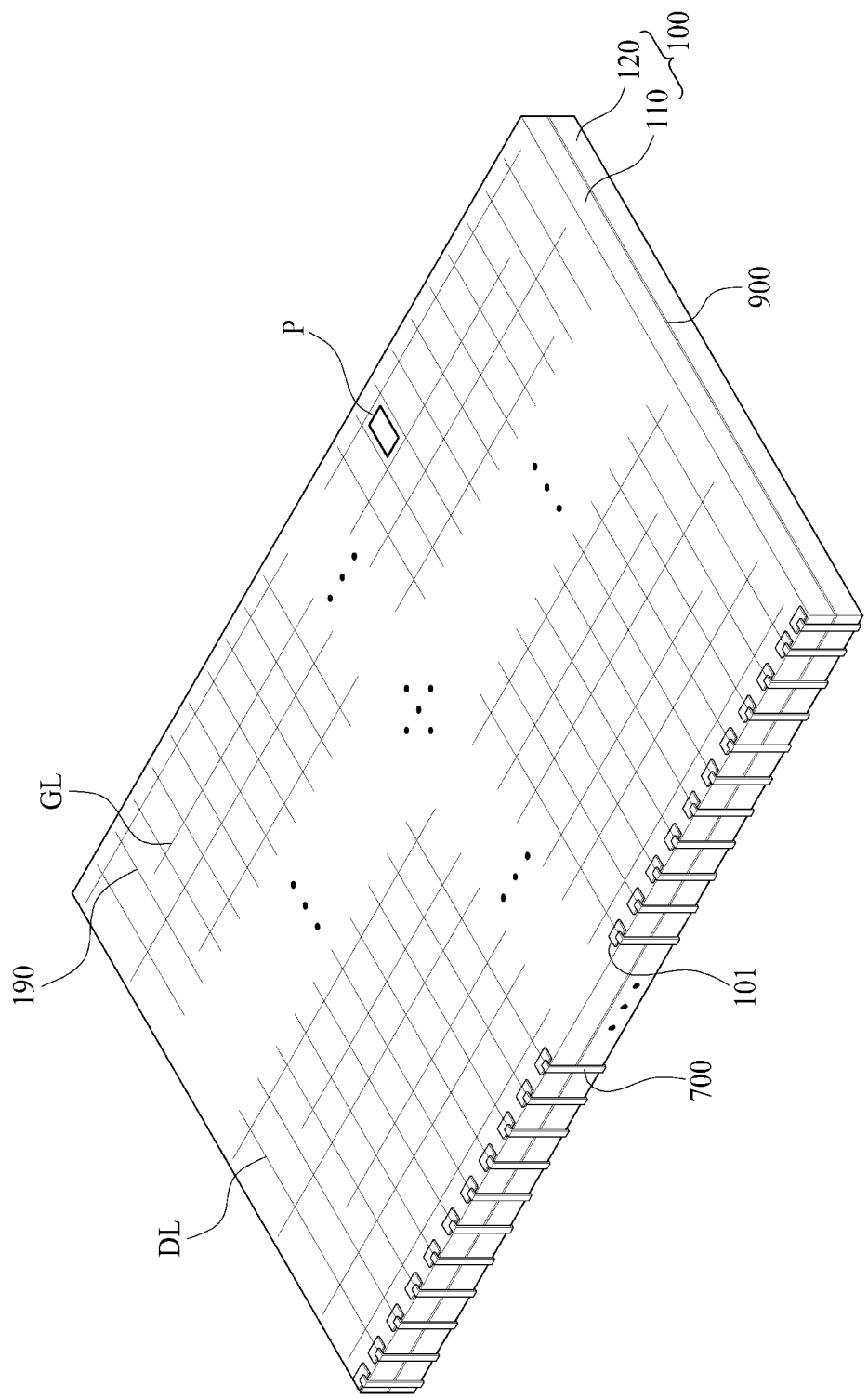
FIG. 4 is a perspective view illustrating a front surface of a display apparatus according to the present disclosure.
Figure 5:
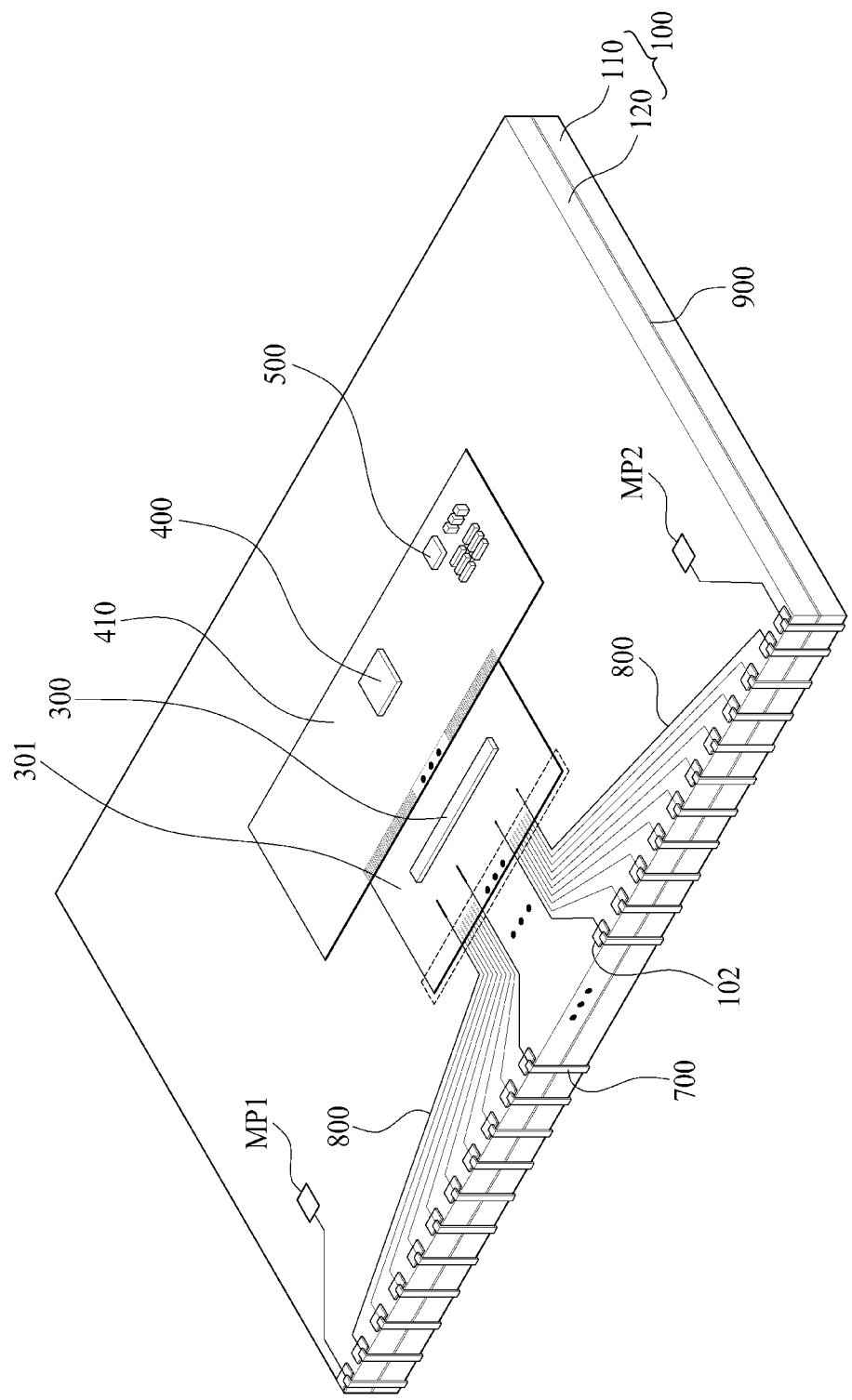
FIG. 5 is a perspective view illustrating a rear surface of a display apparatus according to the present disclosure.

FIG. 4 is a perspective view illustrating a front surface of a display apparatus according to the present disclosure, and FIG. 5 is a perspective view illustrating a rear surface of a display apparatus according to the present disclosure.

As described above, the display apparatus according to an embodiment of the present disclosure may include the display panel 100, the gate driver 200, the data driver 300, the control unit 400, and the power supply 500. In the following description, details which are the same or similar to details described above are omitted or will be briefly described.

Pixels P, a first gate line GL1 to a gth gate line GLg, and data lines DL1 to DLd may be provided in the display panel 100. Particularly, as illustrated in FIG. 4, the pixels P, the gate lines GL, and the data lines DL may be provided on the front surface of the display panel 100.

As illustrated in FIGS. 4 and 5, a routing line 700 may be provided in the lateral surface of the display panel 100, and link lines 800 connected to the data lines DL may be provided in the rear surface of the display panel 100.

First, gate lines GL, data lines DL, power supply lines, and clock lines may be provided in the front surface of the display panel 100.

The power supply lines, for example, may include a line supplying a first voltage GVDD to the light emitting device ED, a line supplying a second voltage GVSS to the light emitting device ED, and at least one line supplying power to the gate driver 200.

The clock lines may include at least one line supplying clocks beneficial for the gate driver 200 to the gate driver 200, and the like.

Hereinafter, for convenience of description, each of the data lines DL, power supply lines, and clock lines may be referred to as a signal line 190. The signal line 190 may extends to the rear surface of the display panel 100 through the routing line 700 provided in the lateral surface of the display panel 100 and may be connected to the link line 800 provided in the rear surface.

That is, the signal line 190 may be connected to any one of front pads 101 provided in the front surface of the display panel 100, a front pad 101 may be connected to the routing line 700, the routing line 700 may be connected to any one of rear pads 102 provided in the rear surface of the display panel 100, and a rear pad 102 may be connected to the link line 800. Accordingly, the signal line 190 provided in the front surface of the display panel 100 may be connected to the link line 800 provided in the rear surface of the display panel 100 through the front pad 101 provided in the front surface of the display panel 100, the routing line 700 provided in the lateral surface of the display panel 100, and the rear pad 102 provided in the rear surface of the display panel 100.

The link line 800 may be connected to any one of the data driver 300, the controller 400, and the power supply 500. That is, some of the link lines 800 may be connected to the data driver 300, some of the link lines 800 may be connected to the controller 400, and some of the link lines 800 may be connected to the power supply 500.

The display panel 100 may include one base substrate. In this case, pixels P, gate lines GL, data lines DL, power supply lines, clock lines, and stages Stage 1 to Stage m may be provided in the front surface of the base substrate. Link lines 800 may be provided in the rear surface of the base substrate. Moreover, a first printed circuit board 301 equipped with a data driver 300 and a second printed circuit board 410 equipped with a control unit or controller 400 and a power supply 500 may be provided in the rear surface of the base board.

The display panel 100 may be formed by bonding a first panel 110 including a first base substrate and a second panel 120 including a second base substrate. In this case, pixels P, gate lines GL, data lines DL, power supply lines, clock lines, and stages Stage 1 to Stage m may be provided in the first panel 110. Link lines 800 may be provided in the second panel 120, and a first printed circuit board 301 equipped with a data driver 300 and a second printed circuit board 410 equipped with a control unit or controller 400 and a power supply 500 may be provided in the second panel 120. The first panel 110 and the second panel 120 may be bonded together by an adhesive 900, and particularly, the first base substrate and the second base substrate may be bonded together by the adhesive 900. In this case, a surface in which the gate lines GL are provided may be referred to as the front surface of the display panel 100, and a surface in which the link lines 800 are provided may be referred to as the rear surface of the display panel 100.

That is, the display panel 100 may include one base substrate, and in this case, the above-described various elements may be provided in the front surface and the rear surface of the base substrate. Moreover, the display panel 100 may be manufactured by bonding the first panel 110 and the second panel 120 which include the above-described various elements.

Hereinafter, for convenience of description, as illustrated in FIGS. 4 and 5, the display panel 100 including the first panel 110 and the second panel 120 will be described as an example of the present disclosure. Accordingly, the following description may be applied to the display panel 100 including one base substrate.

As described above, in the front surface of the display panel 100, in the display area AA including the pixels P, a first stage Stage 1 to an mth stage Stage m generating gate signals GS supplied to the first gate line GL1 to the gth gate line GLg may be provided. That is, the gate driver 200 may include the stages Stage 1 to Stage m, each of the stages Stage 1 to Stage m may include transistors, and the transistors configuring the stages Stage 1 to Stage m may be provided in the display area AA of the front surface of the display panel 100.

For example, the mth stage Stage m configuring the gate driver 200 may include mth branch circuit units Bm and in each of the mth branch circuit units Bm, at least one transistor may be provided. The mth branch circuit units Bm may be provided between the pixels P.

In the display apparatus according to an embodiment of the present disclosure, because the gate driver 200 is provided in the display area AA, the non-display area in which an image is not displayed may be reduced or removed, and thus, the size of the display area may be increased compared to a display panel of the related art of the same size. Accordingly, according to the display apparatus of the present disclosure, the immersion of a user may increase.

In this case, each of the first stage Stage 1 to the mth stage Stage m may be connected to at least one gate line GL.

For example, one Stage may be connected to one gate line GL, one Stage may be connected to two gate lines GL as illustrated in FIG. 2, and one Stage may be connected to three or more gate lines GL.

The number of gate lines GL connected to one Stage may be variously changed based on structures of the stages, a size of the display panel 100, a resolution of the display panel 100, and the like.

Transistors included in the first stage Stage 1 may be dispersed to be provided between pixels P provided along at least one gate line connected to the first stage Stage 1. For example, as described with reference to FIG. 2, the first branch circuit units B1 configuring the first stage Stage 1 may be dispersed to be provided between pixels P arranged along two gate lines connected to the first stage Stage 1, and at least one transistor may be provided in each of the first branch circuit units B1.

Transistors included in the second stage to mth stage Stage m may be also provided in the display panel 100 in the same shape.

As the branch circuit units configuring the stages are provided in the display area AA, the size of the display area AA may be increased.

Hereinafter, for convenience of description, as illustrated in FIG. 2, the display panel 100 in which two gate lines GL are connected to one stage will be described as an example of the present disclosure.

A first monitoring line ML1 outputting a first monitoring signal MS1 may be further connected to the first stage Stage 1 among the first stage Stage 1 to the mth stage Stage m. The first monitoring line ML1 may extend to the rear surface through the lateral surface of the display panel 100.

For example, the first monitoring line ML1 may be connected to the first link line provided on the rear surface of the display panel 100 through the first front pad provided outside the front surface of the display panel 100, a first routing line provided in the lateral surface of the display panel 100 and connected to the first front pad, and the rear pad provided in the rear surface of the display panel 100. Here, the first front pad means any one of the front pads 101, the first routing line means any one of the routing lines 700, and the first rear pad means any one of the rear pads 102, and the first link line means any one of the link lines 800. Accordingly, in the following description, the first routing line may be also simply referred to as a routing line and the first link line may be also simply referred to as a link line.

That is, like the signal lines 190, the first monitoring line ML1 may be connected to the link line 800 through the front pad 101, the routing line 700, and the rear pad 102.

Here, the first stage Stage 1 to the mth stage Stage m do not mean arrangement order within the display panel 100. That is, the first stage Stage 1 is not necessarily provided at an uppermost end of the display panel 100, and the mth stage Stage m is not necessarily provided at a lowermost end of the display panel 100. Accordingly, the first stage Stage 1 may be provided in various positions of the display panel 100 to be connected to at least one of the first gate line GL1 to the gth gate line GLg.

However, in FIG. 2, the display panel 100 in which the first stage Stage 1 is provided at the uppermost end of the display panel 100 is illustrated as an example of the present disclosure. Here, the uppermost end of the display panel 100 means an area adjacent to the routing lines 700.

That is, the first stage Stage 1 may be provided at one end of the display area AA in the second direction Y different from the first direction X in which the gate lines GL1 to GLg are provided.

For example, the first direction X, as illustrated in FIGS. 1 and 2, may be a horizontal direction of the display panel 100 and may mean a direction in which each of gate lines GL1 to GLg extends. The second direction Y may be a vertical direction of the display panel 100 and may mean a direction in which each of data lines DL1 to DLd extends.

In this case, the first stage Stage 1 may be provided at one end of the second direction Y. In the display panel 100 illustrated in FIGS. 1 and 2, the second direction Y may be a vertical direction of the display panel 100, and thus, the first stage Stage 1 may be provided at an uppermost end or a lowermost end of the display panel 100.

That is, although the display panel 100 in which the first stage Stage 1 is provided at an uppermost end of the display panel 100 is illustrated in FIG. 2 as an example of the present disclosure, the first stage Stage 1 may be provided at a lowermost end of the display panel 100.

Particularly, when the first monitoring line ML1 is connected only to the first stage Stage 1, the first stage Stage 1 may be provided at an uppermost end of the display panel 100.

In this case, the first stage Stage 1 may be connected to a first gate line GL1, and the mth stage Stage m may be connected to the gth gate line GLg.

When the first stage Stage 1 is provided at an uppermost end of the display panel 100, a length of the first monitoring line ML1 may be minimized or reduced, and thus, a resistance of the first monitoring line ML1 may be minimized or reduced and a parasitic capacitance generated in the first monitoring line ML1 may be minimized or reduced. Therefore, noise included in a first monitoring signal MS1 transmitted through the first monitoring line ML1 may be minimized or reduced, and thus, the first monitoring signal MS1 may be accurately analyzed.

For example, as illustrated in FIGS. 2 and 4, in the display panel in which a routing line 700 connected to the first monitoring line ML1 is provided on an upper lateral surface among lateral surfaces of the display panel 100, when the first monitoring line ML1 is provided at an uppermost end of the display panel 100, a length of the first monitoring line ML1 may be minimized or reduced. Generally, the strength, waveform, and noise of the first monitoring signal MS1 transmitted to the monitoring device through the first monitoring line ML1 are affected by the resistance and parasitic capacitance of the first monitoring line ML1, and the resistance and parasitic capacitance of the first monitoring line ML1 are affected by a length of the first monitoring line ML1. Accordingly, when the length of the first monitoring line ML1 is minimized or reduced, the resistance and parasitic capacitance of the first monitoring line ML1 may be minimized or reduced. Accordingly, a noise included in the first monitoring signal MS1 may be minimized or reduced, and thus, accurate analysis of the first monitoring signal MS1 may be performed.

Here, the first monitoring signal MS1 may have the same waveform and characteristics as a gate signal GS output from the first stage Stage 1. Accordingly, when the first monitoring signal MS1 is analyzed, it may be determined whether the first stage Stage 1 is normally operating, and also the gate signal GS output from the first stage Stage 1 is normal. By this determination, whether the second to mth stages are normal may also be predicted.

That is, the first monitoring signal MS1 is a signal used to determine whether the gate driver 200 provided in the display area AA is normal. When the first monitoring signal MS1 is determined to be normal, it may be determined that the first stage Stage 1 is normally driven, and it may be also determined that the gate driver 200 including the first stage Stage 1 is normally driven.

In the above, an example in which the first stage Stage 1 is provided at an uppermost end of the display panel 100 has been described with reference to FIG. 2, but a position of the first stage Stage 1 to be monitored is not necessarily an uppermost end of the display panel 100. Accordingly, a position of the first stage Stage 1 may be variously set based on the size, shape, and characteristics of the display panel 100 to be monitored.

Each of the first gate line GL1 to gth gate line GLg may extend from one end to the other end of the display panel 100 in the first direction X, the first monitoring line ML1 may include a first line L1 extending in a second direction Y different from the first direction X, and the first line L1 may extends to a rear surface of the display panel through a lateral surface of the display panel 100. That is, the first line L1 may be connected to the link line 800 provided in the rear surface of the display panel 100 through the front pad 101, the routing line 700 and the rear pad 102.

As described above, the first direction X may be a horizontal direction of the display panel 100 illustrated in FIGS. 1 and 2, and in this case, the second direction Y may be a vertical direction of the display panel 100.

That is, in the embodiments of the present disclosure, when the gate lines GL1 to GLg extend in a first direction, the first monitoring line ML1 may extend in a second direction vertical to the gate lines GL1 to GLg. Accordingly, the arrangement structure of the first monitoring line ML1 may be completely different from the arrangement structure of the gate lines GL1 to GLg.

To provide an additional description, the first monitoring line ML1 may extend in a direction different from that of the first gate line GL1 to the gth gate line GLg.

Particularly, as described above, when the first stage Stage 1 to which the first monitoring line ML1 is connected is provided at an uppermost end of the display panel 100, the first monitoring line ML1 may extend to the rear surface through the routing line 700 provided at the uppermost end of the panel 100. Accordingly, a length of the first monitoring line ML1 may be very short compared to that of the gate line GL.

In this case, the first monitoring line ML1 may include a first line L1 extending from the first stage Stage 1 toward the uppermost end of the display panel 100, and thus, the first line L1 may be formed to be vertical to the gate lines GL1 to GLg.

However, the first monitoring line ML1 may further include a second line provided between the first stage Stage 1 and the first line L1.

In this case, the second line may be provided along the first direction X.

That is, the first monitoring line ML1 may extend in the second direction Y from the first stage Stage 1 and then be connected to the routing line 700 through the front pad 101, but the first monitoring line ML1 may extend along the first direction X from the first stage Stage 1 and then extend in the second direction Y to be connected to the routing line 700 through the front pad 101.

A line extending from the first stage Stage 1 in the first direction X is referred to as a second line, and a line extending from the second line in the second direction Y is referred to as a first line L1.

The second line extends in the first direction X, but a length of the second line may be shorter than each of the first gate line GL1 to the gth gate line GLg. That is, the second line may perform a function of connecting the first line L1 and the first stage Stage 1 between the first line L1 and the first stage Stage 1. Accordingly, the second line does not need to extend long along the first direction like the gate line GL. Accordingly, an entire length of the first monitoring line ML1 may be shorter than that of the gate line GL.

Finally, the first monitoring line ML1 may extend to the rear surface of the display panel 100 through the front pad 101, the routing line 700, and the rear pad 102, and as illustrated in FIG. 5, may be connected to a first monitoring pad MP1 through the link line 800 connected to the rear pad 102 in the rear surface of the display panel 100.

The first monitoring pad MP1 may be connected to a monitoring device. As described above, the monitoring device may analyze a first monitoring signal MS1 transmitted through the first monitoring line ML1 to determine whether the gate signal GS is normally output in the first stage Stage 1.

When it is determined that the gate signal GS output from the first stage Stage 1 is normal, it may be determined that the first stage Stage 1 is normal, and through this, it may be determined that the gate driver 200 is normal.

Particularly, according to an embodiment of the present disclosure, a gate line GL, a data line GL, and a first monitoring line ML1 are provided in a front surface of the display panel 100, a link line 800 and a first monitoring pad MP1 are provided in a rear surface of the display panel 100, the first monitoring line ML1 and the first monitoring pad MP1 are connected through the routing line 800, and then, an operation of the gate driver 200 may be monitored.

That is, according to an embodiment of the present disclosure, the operation of the gate driver 200 can be monitored after the display panel 100 is finally completed so that it can be mounted on a product and sold. Accordingly, whether the gate driver 200 is defective can be determined at the final step of the manufacturing process, and thus, the defective rate of the final product can be reduced.

To provide an additional description, after the first panel 110 provided with front pads 101 and the second panel 120 provided with rear pads 102 are individually manufactured, the first panel 110 and the second panel 120 are bonded by an adhesive 900, and the routing lines 700 connecting the front pads 101 and the rear pads 102 are provided in the lateral surface of the first panel 110 and the second panel 120, and then, finally, manufacturing of the display panel 100 is completed.

Even when the display panel 100 includes one base substrate, after stages and front pads 101 are provided on a front surface of the base substrate and link lines 800 and rear pads 102 are provided on a rear surface of the base substrate, routing lines 700 connecting the front pads 101 and the rear pads 102 are provided on a lateral surface of the display panel 100, and then, finally, manufacturing of the display panel 100 is completed.

In the related art, an operation of a gate driver 200 was monitored only after a first panel 110 was manufactured or after stages were provided on a front surface of a base substrate, and the operation of the gate driver 200 could not be monitored after routing lines 700 were provided on a lateral surface of a display panel 100.

However, according to the display apparatus according to an embodiment of the present disclosure, even after the routing lines 700 are provided on a lateral surface of the display panel 100, the first monitoring signal MS1 output from the first stage Stage 1 and transmitted through the first monitoring pad MP1 may be monitored, and thus, an operation of the gate driver 200 may be monitored.

Figure 6:
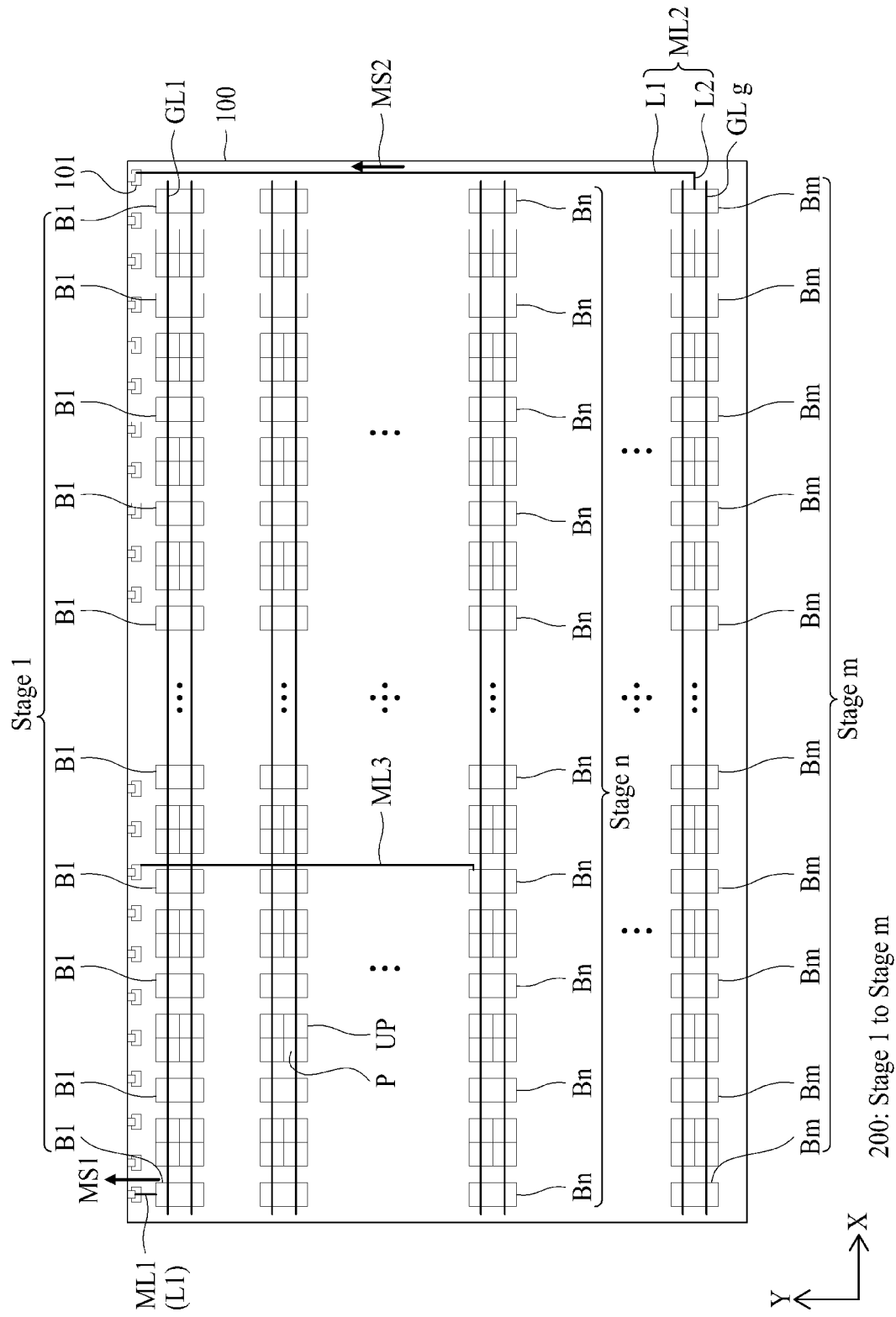
FIG. 6 is another example diagram illustrating a display panel illustrated in FIG. 1.

FIG. 6 is another example diagram illustrating a display panel illustrated in FIG. 1.

As described above, the first stage Stage 1 to which a first monitoring line ML1 is connected may be provided in various positions of the display panel 100, and particularly, may be provided in a position close to a routing line 700. When the first stage Stage 1 is provided at a position close to the routing line 700, a length of the first monitoring line ML1 can be shortened, and thus, the quality of the first monitoring signal MS1 can be improved, and thus, the quality of the first stage Stage 1 can be more accurately determined.

That is, when the first monitoring line ML1 is connected to the first stage Stage 1, the first stage Stage 1 may be provided in a position adjacent to the routing line 700 (i.e., an uppermost end of the display panel illustrated in FIGS. 2n and 6), and may be connected to the first gate line GL1. In this case, the mth stage Stage m may be provided at a lowermost end of the display panel 100 and may be connected to the gth gate line GLg.

In one embodiment of the present disclosure, a second monitoring line ML2 performing the same function as the first monitoring line ML1 may be further connected to another stage as well as the first stage Stage 1.

The second monitoring line ML2 may also be connected to any one of a second stage to mth stage Stage m.

However, when the first monitoring line ML1 is connected to the first stage Stage 1 provided at the uppermost end of the display panel 100, the second monitoring line ML2, as illustrated in FIG. 6, may be connected to the mth stage Stage m provided at the lowermost end of the display panel 100.

That is, when the first monitoring signal MS1 received through the first monitoring line ML1 connected to the first stage Stage 1 provided at the uppermost end of the display panel 100 and the second monitoring signal MS2 received through the second monitoring line ML2 connected to the mth stage Stage m provided at the lowermost end of the display panel 100 are determined to be normal, the first stage Stage 1 and the mth stage Stage m may be determined to be normal. Moreover, because the first stage Stage 1 and the mth stage Stage m are normal, a second stage to the m–1th stage provided between the first stage Stage 1 and the mth stage Stage m may also be determined to be normal, and thus, it may be determined that the gate driver 200 is normal.

However, when it is determined that any one of the first monitoring signal MS1 and the second monitoring signal MS2 is not normal, it may be determined that the gate driver 200 is not normal.

To this end, in one embodiment of the present disclosure, a second monitoring line ML2 outputting the second monitoring signal MS2 may be further connected to the mth stage Stage m, and the second monitoring line ML2 may extend to the rear surface of the display panel 100 through the lateral surface of the display panel 100. That is, the second monitoring line ML2 may also be connected to the link line 800 provided on the rear surface of the display panel 100 through the front pad 101, the routing line 700, and the rear pad 102.

In this case, the mth stage Stage m may be provided at the other end of the display area AA in the second direction Y.

As illustrated in FIG. 6, the second monitoring line ML2 may include a first line L1 extending from the mth stage Stage m along the second direction Y, and the first line L1 may be connected to a routing line 700. As illustrated in FIG. 5, the routing line 700 connected to the first line L1 may be connected to the second monitoring pad MP2 through the link line 800 provided on the rear surface of the display panel 100.

Like the first monitoring pad MP1, the second monitoring pad MP2 may be connected to the monitoring device.

The second monitoring line ML2 may include a first line L1 extending in the second direction and a second line L2 extending in the first direction between the first line L1 and the mth stage Stage m. In this case, because the second line L2 is provided only between the first line L1 and the mth stage Stage m, a length of the second line L2 may be shorter than that of the gate line GL.

In one embodiment of the present disclosure, as illustrated in FIG. 6, another monitoring line ML3 performing the same function as the first monitoring line ML1 and the second monitoring line ML2 may be further connected another staged as well as the first stage Stage 1 and the mth stage Stage m. That is, three or more monitoring lines may be provided in the display apparatus according to one embodiment of the present disclosure.

To provide an additional description, another monitoring line outputting another monitoring signal may be further connected to at least one of the second stage to the m−1th stage, and another monitoring line may extend to the rear surface of the display panel 100 through the lateral surface of the display panel 100. That is, another monitoring line may also be connected to the link line 800 provided on the rear surface of the display panel 100 through the front pad 101, the routing line 700 and the rear pad 102.

For example, in a case where performance evaluation is need for nth stage (Stage n, n is a natural number less than m) provided at a center portion of the display panel 100 as well as stages (Stage 1, Stage m) provided at the uppermost end and lowermost end of the display panel 100, the third monitoring line ML3 may be connected to the nth stage Stage n.

The third monitoring line ML3 may be connected to a routing line 700 provided on the lateral surface of the display panel 100, and the routing line 700 connected to the third monitoring line ML3 may be connected to a third monitoring pad through a link line 800 provided on the rear surface of the display panel 100.

The third monitoring pad may also be connected to the monitoring device like the first monitoring pad MP1 and the second monitoring pad MP2.

The third monitoring line ML3 may include a first line extending in the second direction and a second line extending in the first direction between the first line and the nth stage Stage n.

Figure 7:
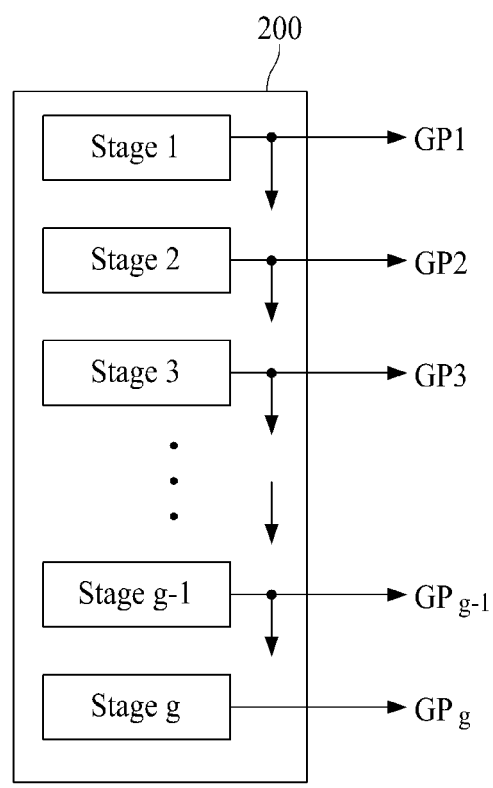
FIG. 7 is an example diagram illustrating a configuration of a gate driver applied to a display apparatus according to an embodiment of the present disclosure.
Figure 8:
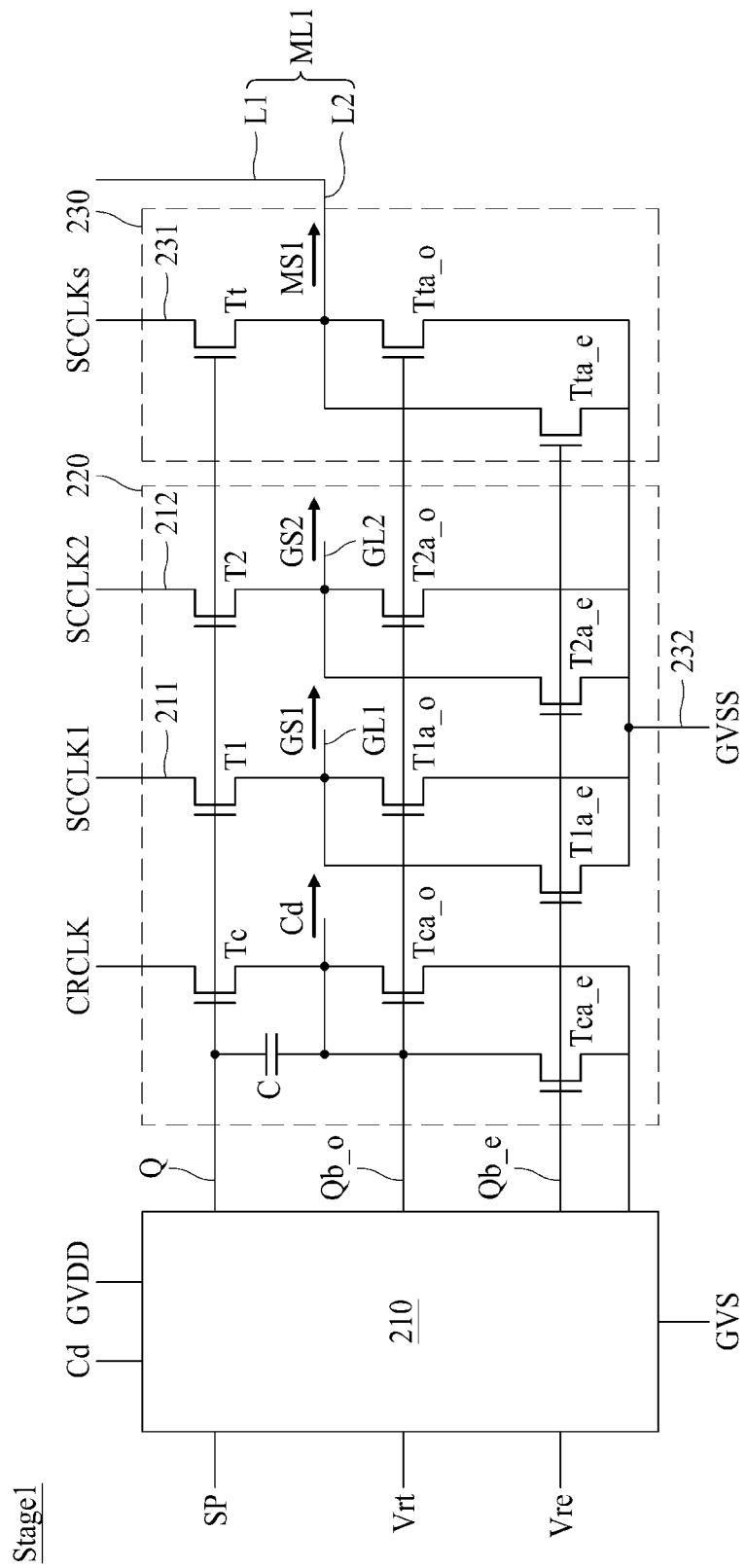
FIG. 8 is an example diagram illustrating a first stage of the gate driver illustrated in FIG. 7.

FIG. 7 is an example diagram illustrating a configuration of a gate driver applied to a display apparatus according to an embodiment of the present disclosure, and FIG. 8 is an example diagram illustrating a first stage of the gate driver illustrated in FIG. 7.

As illustrated in FIG. 7, the gate driver 200 may include a first stage Stage 1 to an mth stage Stage m, and each of the first stage Stage 1 to the mth stage Stage m is connected to at least one gate line GL.

As described above, the first monitoring line ML1 may be connected to the first stage Stage 1.

When the second monitoring line ML2 is also connected to the mth stage Stage m, the mth stage Stage m may have the same structure as the first stage Stage 1 illustrated in FIG. 8.

That is, a stage to which a monitoring line is connected may have the same structure as the first stage Stage 1.

In a stage to which a monitoring line is not connected, a monitoring buffer 230 among elements illustrated in FIG. 8 may not be provided. To provide an additional description, a shift register 210 and a buffer 220 illustrated in FIG. 8 may be provided in common to all stages, and the monitoring buffer 230 may be further included in the stage to which the monitoring line is connected. A detailed description of the configuration of the stages is as follows.

First, each of the stages may include transistors, and gate control signals may be supplied to each of the stages. Each of the stages may generate gate pulses GP1 to GPg using various types of signals and voltages, and then sequentially supplies the gate pulses GP1 to GPg to the gate lines GL1 to GLg.

To this end, each of the first stage Stage 1 to the mth stage Stage m, as illustrated in FIG. 8, may include a shift register 210 and a buffer 220.

The shift register 210 may be driven by a start signal transmitted from the previous stage or the controller 400. In the following description, the previous Stage may be the immediately preceding stage, but is not limited thereto. Particularly, the first stage Stage 1 may be driven by a start signal Vrt transmitted from the controller 400.

A selection control signal SP for selecting a gate line to be sensed, an initialization signal Vre for initializing a Q node Q connected to the buffer 220, and a first voltage GVDD may be supplied to the shift register 210.

Moreover, a carry signal Cd may be supplied to the shift register 210 from the previous stage. Particularly, a carry signal Cd supplied to the first stage Stage 1 may be transmitted from the controller 400.

The shift register 210 may be formed in various structures to generate signals for controlling the buffer 220. Because the features of one embodiment of the present disclosure may not be in the shift register 210, a detailed structure of the shift register 210 and a detailed description thereof are omitted.

The buffer 220 may be connected to at least one gate line. Hereinafter, for convenience of description, the gate driver 200 in which each of a first stage Stage 1 to an mth stage Stage m is connected to two gate lines GL will be described as an example of the present disclosure.

Accordingly, two gate lines may be connected to the buffer 220 of the first stage Stage 1, for example, a first gate line GL1 and a second gate line GL2 may be connected to the buffer 220.

The buffer 220 may include at least one pull-up transistor outputting a gate pulse GP and at least one pull-down transistor outputting a gate off signal.

For example, as illustrated in FIG. 8, the buffer 220 may include two pull-up transistors T1 and T2 and four pull-down transistors $T1a\_o$, $T1a\_e$, $T2a\_o$, and $T2a\_e$.

A gate of each of the two pull-up transistors T1 and T2 may be connected to the Q node Q of the shift register 210.

A gate of each of the four pull-down transistors T1a_o, T1a_e, T2a_o, and T2a_e may be connected to a Qb node Qb of the shift register 210. The Qb node Qb may include a Qb_o node Qb_o and a Qb_e node Qb_e.

A first terminal of the first pull-up transistor T1 may be connected to a first gate clock line 211 to which a first gate clock SCCLK1 is input, and a second terminal of the first pull-up transistor T1 may be connected to the first gate line GL1.

A first terminal of the second pull-up transistor T2 may be connected to a second gate clock line 212 to which a second gate clock SCCLK2 is input, and a second terminal of the second pull-up transistor T2 may be connected to the second gate lines GL2.

The first pull-up transistor T1 may be turned on by a Q node signal input from the Q node Q, and output the first gate clock SCCLK1. The first gate clock SCCLK1 may become the first gate pulse GP1 output to the first gate line GL1.

The second pull-up transistor T2 may be turned on by a Q node signal input from the Q node Q, and outputs the second gate clock SCCLK2. The second gate clock SCCLK2 may become the second gate pulse GP2 output to the second gate line GL2.

A first odd pull-down transistor T1a_o may be turned on by a Qb_o node signal input from the Qb_o node Qb_o, and output a second voltage GVSS. The second voltage GVSS may become a gate off signal output to the first gate line GL1. A first even pull-down transistor T1a_e may be turned on by a Qb_e node signal input from the Qb_e node Qb_e, and outputs a second voltage GVSS. The second voltage GVSS may become a gate off signal output to the first gate line GL1. That is, the first odd pull-down transistor T1a_o and the first even pull-down transistor T1a_e may be alternately turned on to output a gate off signal to the first gate line GL1.

A second odd pull-down transistor T2a_o may be turned on by a Qb_o node signal input from the Qb_o node Qb_o, and output a second voltage GVSS. The second voltage GVSS may become a gate off signal output to the second gate line GL2. A second even pull-down transistor T2a_e may be turned on by a Qb_e node signal input from the Qb_e node Qb_e, and output a second voltage GVSS. The second voltage GVSS may become a gate off signal output to the second gate line GL2. That is, the second odd pull-down transistor T2a_o and the second even pull-down transistor T2a_e may be alternately turned on to output a gate off signal to the second gate line GL2.

However, when the gate off signal does not need to be output alternately, only one of the first odd pull-down transistor T1a_o and the first even pull-down transistor T1a_e may be provided, and the second odd pull-down transistor T2a_o and the second even pull-down transistor T2a_e.

The buffer 220 including the first pull-up transistor T1, the second pull-up transistor T2, and four pull-down transistors T1a_o, T1a_e, T2a_o, and T2a_e, and the shift register 210 may be provided in each of the first stage Stage 1 to the mth stage Stage m in common.

The first stage Stage 1 to which the first monitoring line ML1 is connected may further include a first monitoring buffer 230 connected to the first monitoring line ML1.

That is, the first stage Stage 1 may further include a first monitoring buffer 230 outputting the first monitoring signal MS1.

As described above, the first monitoring line ML1 may be connected to the link line 800 through the routing line 700, and the first monitoring pad MP1 is connected to the link line 800.

Second, the first monitoring buffer 230 may include a first monitoring pull-up transistor (Tt) and a first monitoring pull-down transistor (Tta).

A gate of the first monitoring pull-up transistor Tt may be connected to a gate of at least one pull-up transistor included in the buffer 220. For example, in Stage 1 illustrated in FIG. 8, the gate of the first monitoring pull-up transistor Tt may be connected to gates of the first pull-up transistor T1 and the second pull-up transistor T2.

A gate of the first monitoring pull-down transistor Tta may be connected to gate of at least one pull-down transistor. For example, when the first monitoring pull-down transistor Tta includes the first odd monitoring pull-down transistor Tta_o and the first even monitoring pull-down transistor Tta_e in the first stage Stage 1 illustrated in FIG. 8, a gate of the first odd monitoring pull-down transistor Tta_o may be connected to gates of the first odd pull-down transistor T1a_o and the second odd pull-down transistor T2a_o, and a gate of the first even monitoring pull-down transistor Tta_e may be connected to gates of the first even pull-down transistor T1a_e and the second even pull-down transistor T2a_e.

In this case, the first odd monitoring pull-down transistor Tta_o and the first even monitoring pull-down transistor Tta_e may be alternately turned on to output the first monitoring signal MS1 corresponding to the gate off signal.

When the first odd monitoring pull-down transistor Tta_o and the first even monitoring pull-down transistor Tta_e do not need to be alternately turned on, only one of the first odd monitoring pull-down transistor Tta_o and the first even monitoring pull-down transistor Tta_e may be provided.

A first terminal of the first monitoring pull-up transistor Tt may be connected to the monitoring gate clock line 231 to which the monitoring gate clock SCCLKs is input, and a second terminal of the first monitoring pull-up transistor Tt may be connected to the first monitoring line ML1.

That is, the first monitoring pull-up transistor Tt may have the same structure as the first pull-up transistor T1 and the second pull-up transistor T2, and a monitoring gate clocks SCCLKs different from the first gate clock SCCLK1 and the second gate clock SCCLK2 may be supplied to the first terminal of the first monitoring pull-up transistor Tt.

A first terminal of the first monitoring pull-down transistor Tta may be connected to a monitoring off voltage line 232 to which a gate off voltage (second voltage GVSS) corresponding to the gate off signal is supplied, and a second terminal of the first monitoring pull-down transistor Tta may be connected to the first monitoring line ML1.

That is, first terminals of the first odd monitoring pull-down transistor Tta_o and the first even monitoring pull-down transistor Tta_e may be connected to the monitoring off voltage line 232, and second terminals of the first odd monitoring pull-down transistor Tta_o and the first even monitoring pull-down transistor Tta_e may be connected to the first monitoring line ML1.

The first monitoring pull-up transistor Tt may be turned on by the Q node signal input from the Q node Q, and output the monitoring gate clock SCCLKs. The monitoring gate clock SCCLKs may become the first monitoring signal MS1 output to the first monitoring line ML1.

The first monitoring signal MS1 output through the first monitoring pull-up transistor Tt may have the same shape as that of the first gate pulse GP1 output to the first gate line GL1 and the second gate pulse GP2 output to the second gate line GL2. However, the timing at which the first monitoring signal MS1 is output through the first monitoring pull-up transistor Tt may be different from the timing at which the first gate pulse GP1 and the second gate pulse GP2 are output.

Accordingly, when the first monitoring signal MS1 output through the first monitoring pull-up transistor Tt is determined to be normal, the first gate pulse GP1 and the second gate pulse GP2 may be also determined to be normal.

The first odd monitoring pull-down transistor Tta_o may be turned on by the Qb_o node signal input from the Qb_o node Qb_o, and output a second voltage GVSS. The second voltage GVSS may configure the first monitoring signal MS1. The first monitoring signal MS1 output from the first odd monitoring pull-down transistor Tta_o may correspond to a gate off signal output to the first gate line GL1 or the second gate line GL2.

The first even monitoring pull-down transistor Tta_e may be turned on by the Qb_e node signal input from the Qb_e node Qb_e, and output a second voltage GVSS. The second voltage GVSS may configure the first monitoring signal MS1. The first monitoring signal MS1 output from the first even monitoring pull-down transistor Tta_e may correspond to a gate off signal output to the first gate line GL1 or the second gate line GL2.

Accordingly, when the first monitoring signal MS1 output through the first odd monitoring pull-down transistor Tta_o and the first even monitoring pull-down transistor Tta_e is determined to be normal, the gate off signal output to the first gate line GL1 and the second gate line GL2 may also be determined to be normal.

That is, the first monitoring signal MS1 may include a signal corresponding to the first gate pulse GP1 and the second gate pulse GP2 output from the first pull-up transistor T1 and the second pull-up transistor T2, and a signal corresponding to the gate off signal output from the first pull-down transistor T1a and the second pull-down transistor T2a. Accordingly, the first monitoring signal MS1 output by the first monitoring pull-up transistor Tt and the first monitoring pull-down transistor Tta may be a signal corresponding to the gate signal GS.

In this case, when the first monitoring signal MS1 output through the first monitoring pull-up transistor Tt, the first odd monitoring pull-down transistor Tta_o, and the first even monitoring pull-down transistor Tta_e is determined to be normal, the first gate signal GS1 and the second gate signal GS2 output from the first stage Stage 1 may also be determined to be normal. In this case, gate signals GS output from the second stage to mth stage Stage m may also be determined to be normal.

However, when the first monitoring signal MS1 output through the first monitoring pull-up transistor Tt, the first odd monitoring pull-down transistor Tta_o, and the first even monitoring pull-down transistor Tta_e is determined to be abnormal, the first gate signal GS1 and the second gate signal GS2 output from the first stage Stage 1 may also be determined to be abnormal. In this case, gate signals GS output from the second stage to mth stage Stage m may also be determined to be abnormal. Accordingly, detailed inspection and repair of the gate driver 200 may be performed, or the display panel 100 including the gate driver 200 may be classified as defective.

FIGS. 9a, 9b, 10a and 10b are example diagrams showing waveforms applied to a display apparatus according to an embodiment of the present disclosure. In the following description, details which are the same or similar to details described with reference with FIGS. 1 to 8 are omitted or will be briefly described.

As described above, each of the first stage Stage 1 to the mth stage Stage m may include a shift register 210 and a buffer 220, and the first stage Stage 1 to which the first monitoring line ML1 is connected may further include a first monitoring buffer 230.

The shift register 210 may receive signals transferred from the previous stage or controller 400 to be driven, and particularly, generate signals transferred to the Q node Q and the Qb node Qb connected to the buffer 220. The Qb node Qb may include a Qb_o node Qb_o and a Qb_e node Qb_e. The Q node Q and the Qb node Qb may also be connected to the first monitoring buffer 230.

By the signals transferred to the Q node Q and the Qb node Qb, the buffer 220 may output at least one gate signal GS, and the first monitoring buffer 230 may output the first monitoring signal MS1 corresponding to the gate signal GS.

The buffer 220 may include at least one pull-up transistor outputting a gate pulse GP and at least one pull-down transistor outputting a gate off signal.

In this case, as illustrated in FIG. 8, the buffers 220 included in each of the first stage Stage 1 to the mth stage Stage m may further include a carry transistor Tc sharing a gate with at least one pull-up transistor.

A gate of the carry transistor Tc may be connected to the Q node Q, a carry clock CRCLK may be supplied to a first terminal of the carry transistor Tc, and a carry signal Cd may be output to a second terminal of the carry transistor Tc. The carry signal Cd may be supplied to the next stage.

The carry pull-down transistor Tca may be connected to the second terminal of the carry transistor Tc. When the first pull-down transistor T1a includes the first odd pull-down transistor T1a_o and the first even-carry pull-down transistor T1a_e, the carry pull-down transistor Tca may include an odd carry pull-down transistor Tca_o and an even carry pull-down transistor Tca_e. A connection structure of the odd carry pull-down transistor Tca_o, the even carry pull-down transistor Tca_e and the carry transistor Tc may be the same as that of the first odd pull-down transistor T1a_o, the first even pull-down transistor T1a_e and the first pull-up transistor T1, and thus, a detailed description thereof is omitted.

A carry capacitor C may be connected between the gate and the second terminal of the carry transistor Tc. The carry capacitor C may stably maintain a voltage difference between the gate and the second terminal of the carry transistor Tc. Accordingly, when the carry transistor Tc is turned on, the carry clock CRCLK can be stably output through the carry transistor C.

The voltage difference between the gate and the second terminal of each of the first pull-up transistor T1, the second pull-up transistor T2, and the first monitoring pull-up transistor Tt may also be stably maintained by the carry capacitor C. That is, voltage of gate of each of the first pull-up transistor T1, the second pull-up transistor T2, and the first monitoring pull-up transistor Tt may be maintained constant by the carry capacitor C. Accordingly, the first gate clock SCCLK1, the second gate clock SCCLK2, and the monitoring gate clock SCCLKs may be output stably through the first pull-up transistor T1, the second pull-up transistor T2, and the first monitoring pull-up transistor Tt.

However, between the gate and the second terminal of each of the first pull-up transistor T1, the second pull-up transistor T2, and the first monitoring pull-up transistor Tt, a capacitor corresponding to the carry capacitor C may be individually provided.

That is, according to the operating characteristics of the carry transistor Tc, the first pull-up transistor T1, the second pull-up transistor T2, and the first monitoring pull-up transistor Tt, only the carry capacitor C may be provided, or alternatively, a capacitor corresponding to the carry capacitor C may be further connected to at least one of the first pull-up transistor T1, the second pull-up transistor T2, and the first monitoring pull-up transistor Tt together with the carry capacitor C.

In this case, a pulse width of the carry clock CRCLK supplied to the carry transistor Tc included in the first stage Stage 1 may be greater than a pulse width of a carry clock supplied to a carry transistor Tc included in the second stage Stage 2.

Figure 9A:
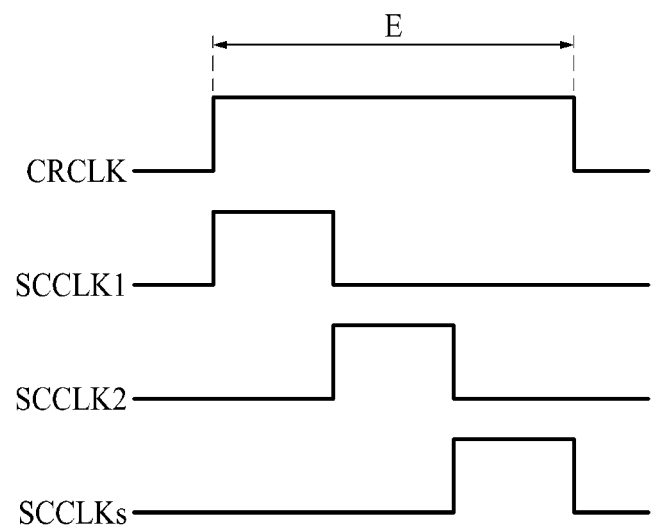
FIGS. 9a, 9b, 10a and 10b are example diagrams showing waveforms applied to a display apparatus according to an embodiment of the present disclosure.
Figure 9B:
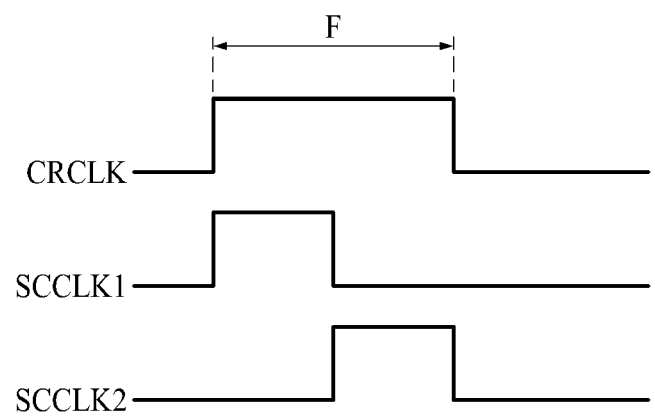

For example, FIG. 9a illustrates a carry clock CRCLK, a first gate clock SCLK1, and a second gate clock SCCLK2 supplied to the first stage Stage 1, and FIG. 9b illustrates a carry clock CRCLK, a first gate clock SCLK1, and a second gate clock SCCLK2 supplied to the second stage Stage 2. Here, the second stage Stage 2 means any one of the stages which do not include the first monitoring buffer 230.

That is, as illustrated in FIG. 9a, a pulse width E of the carry clock CRCLK supplied to the first stage Stage 1 may be greater than or equal to a period during which the first gate clock SCCLK1, the second gate clock SCCLK2, and the monitoring gate clock SCCLKs are output.

However, as illustrated in FIG. 9b, a pulse width F of the carry clock CRCLK supplied to the second stage Stage 2 may be greater than or equal to a period during which the first gate clock SCCLK1 and the second gate clock SCCLK2 are output.

Because pulse widths of the first gate clock SCCLK1, the second gate clock SCCLK2, and the monitoring gate clock SCCLKs are the same, the pulse width of the carry clock CRCLK supplied to the first stage Stage 1 should be greater than the pulse width F of the carry clock CRCLK supplied to the second stage Stage 2.

To provide an additional description, when the first gate clock SCCLK1, the second gate clock SCCLK2, and the monitoring gate clock SCCLKs are output under the same condition, a first gate pulse GP1, a second gate pulse GP2, and a first monitoring signal MS1 may have the same characteristics. When the first gate clock SCCLK1, the second gate clock SCCLK2, and the monitoring gate clock SCCLKs are output under different conditions, the first gate pulse GP1, the second gate pulse GP2, and the first gate pulse GP2 may have different characteristics.

Therefore, in the first stage Stage 1, while the first gate clock SCCLK1, the second gate clock SCCLK2, and the monitoring gate clock SCCLKs are output, the carry clock CRCLK should be maintained at the same level.

Therefore, the pulse width E of the carry clock CRCLK supplied to the first stage Stage 1 should be greater than the pulse width of the carry clock F supplied to the second stage Stage 2.

That is, while the carry clock CRCLK is supplied to the carry transistor Tc included in the first stage Stage 1, at least one gate clock should be supplied to at least one pull-up transistor provided in the buffer 220 and the monitoring gate clock SCCLKs should be supplied to the first monitoring buffer 230. However, while the carry clock CRCLK is supplied to the carry transistor Tc included in the second stage Stage 2, at least one gate clock should be supplied to at least one pull-up transistor provided in the buffer 220.

Accordingly, the pulse width E of the carry clock CRCLK supplied to the first stage Stage 1 should be greater than the pulse width F of the carry clock CRCLK supplied to the second stage Stage 2.

To provide an additional description, in the stages except the first stage Stage 1, the carry clock CRCLK having the pulse width F smaller than the pulse width E of the carry clock CRCLK supplied to the first stage Stage 1 may be input. Accordingly, the stages except the first stage Stage 1 may be driven at the same frequency as a driving frequency of the related art gate driver.

To this end, the controller 400 may generate a carry clock CRCLK supplied to the first stage Stage 1 and a carry clock supplied to the remaining stages.

However, even when the pulse width E of the carry clock CRCLK supplied to the first stage Stage 1 is not greater than the pulse width F of the carry clock supplied to the second stage Stage 2, the first gate clock SCCLK1, the second gate clock SCCLK2, and the monitoring gate clock SCCLKs may be output under the same conditions.

Figure 10A:
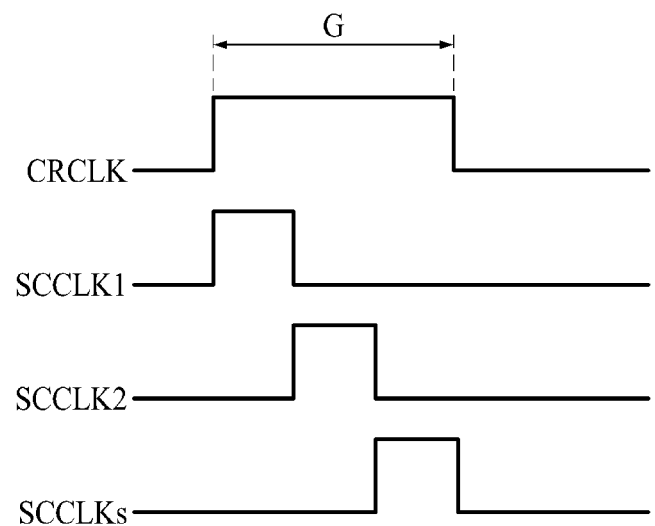
Figure 10B:
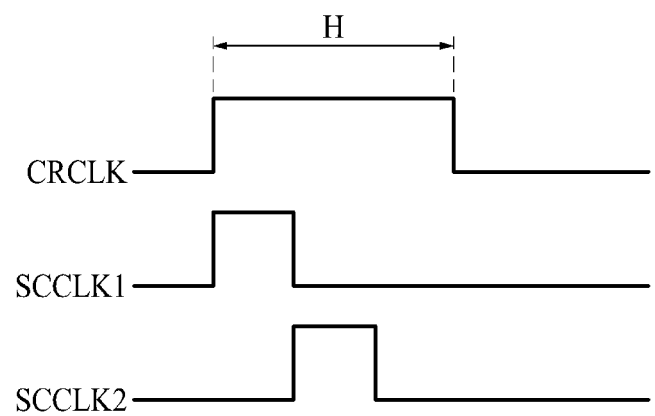

For example, as illustrated in FIGS. 10a and 10b, a pulse width G of a carry clock supplied to a carry transistor Tc included in the first stage Stage 1 may be the same as a pulse width H of a carry clock supplied to a carry transistor Tc included in the second stage Stage 2.

In this case, when the pulse width G of the carry clock CRCLK is the same as a pulse width of a carry clock CRCLK used in the related art gate driver, a pulse width of the first gate clock SCCLK1, each of a pulse width of the gate clock SCCLK2, and a pulse width of the monitoring gate clock SCCLKs may be smaller than a pulse width of each of a first gate clock SCCLK1 and a pulse width of a second gate clock SCCLK2 used in the related art gate driver.

Therefore, the gate driver 200 applied to the display apparatus according to the present disclosure may be driven at the same frequency as a driving frequency of the related art gate driver.

That is, the display apparatus according to one embodiment of the present disclosure may be driven at the same or substantially the same frequency as a driving frequency used in a gate driver of the related art display apparatus.

A display apparatus according to the present disclosure may include the following features.

A display apparatus according to an embodiment of the present disclosure comprises a display panel in which pixels, first to gth gate lines, and data lines are provided (where g is a natural number), and link lines provided on a rear surface of the display panel and connected to the data lines provided on a front surface of the display panel, in a display area including the pixels in the front surface, a first stage to an mth stage generating gate signals to be supplied to the first gate line to the gth gate line are provided (where m is a natural number less than or equal to g), a first monitoring line through which a first monitoring signal is output is further connected to the first stage, and the first monitoring line extends to the rear surface through a lateral surface of the display panel.

According to an embodiment of the present disclosure, transistors included in the first stage are dispersed to be provided between pixels provided along at least one gate line connected to the first stage.

According to an embodiment of the present disclosure, each of the first gate line to the gth gate line extends from one end to the other end of the display panel in the first direction, the first monitoring line comprises a first line extending in a second direction different from the first direction, and the first line extends to the rear surface through the lateral surface.

According to an embodiment of the present disclosure, the first monitoring line further comprises a second line provided between the first stage and the first line, the second line is provided along the first direction, and a length of the second line is shorter than a length of each of the first gate line to the gth gate line.

According to an embodiment of the present disclosure, the first monitoring line is connected to a first monitoring pad provided on the rear surface.

According to an embodiment of the present disclosure, the first monitoring line extends in a direction different from a direction of the first gate line to the gth gate line.

According to an embodiment of the present disclosure, the first stage is provided at one end of the display area in a second direction different from the first direction in which the gate lines extend.

According to an embodiment of the present disclosure, the first stage is connected to the first gate line, and the mth stage is connected to the gth gate line.

According to an embodiment of the present disclosure, a second monitoring line through which a second monitoring signal is output is further connected to the mth stage, and the second monitoring line extends to the rear surface through the lateral surface.

According to an embodiment of the present disclosure, the first stage is provided at one end of the display area in a second direction different from the first direction in which the gate lines extend, and the mth stage is provided at the other end of the display area in the second direction.

According to an embodiment of the present disclosure, another monitoring line through which another monitoring signal is output is further connected to at least one of the second stage to m−1th stage, and the another monitoring line extends to the rear surface through the lateral surface.

According to an embodiment of the present disclosure, each of the first to mth stages comprises a buffer connected to at least one gate line, the buffer comprises at least one pull-up transistor outputting a gate pulse and at least one pull-down transistor outputting a gate off signal, and the first stage further comprises a first monitoring buffer connected to the first monitoring line.

According to an embodiment of the present disclosure, the first monitoring buffer comprises a first monitoring pull-up transistor and a first monitoring pull-down transistor, a gate of the first monitoring pull-up transistor is connected to a gate of the at least one pull-up transistor, and a gate of the first monitoring pull-down transistor is connected to a gate of the at least one pull-down transistor.

According to an embodiment of the present disclosure, a first terminal of the first monitoring pull-up transistor is connected to a monitoring gate clock line to which a monitoring gate clock is supplied, a second terminal of the first monitoring pull-up transistor is connected to the first monitoring line, a first terminal of the first monitoring pull-down transistor is connected to a monitoring off voltage line to which a gate off voltage corresponding to the gate off signal is supplied, and a second terminal of the first monitoring pull-down transistor is connected to the first monitoring line.

According to an embodiment of the present disclosure, the buffers included in each of the first stage to the mth stage further comprises a carry transistor sharing a gate with the at least one pull-up transistor, and a pulse width of a carry clock supplied to the carry transistor included in the first stage is greater than a pulse width of a carry clock supplied to the carry transistor included in the second stage.

According to an embodiment of the present disclosure, the buffers included in each of the first stage to the mth stage further comprises a carry transistor sharing a gate with the at least one pull-up transistor, and a pulse width of a carry clock supplied to the carry transistor included in the first stage is the same as a pulse width of a carry clock supplied to the carry transistor included in the second stage.

According to an embodiment of the present disclosure, while the carry clock is supplied to the carry transistor included in the first stage, at least one gate clock is supplied to the at least one pull-up transistor and the monitoring gate clock is supplied to the first monitoring buffer.

According to an embodiment of the present disclosure, a carry capacitor is connected to one of two terminals of the carry transistor and a gate of the carry transistor.

A display apparatus according to the present disclosure may be applied to all electronic devices including display panels. For example, the display apparatus according to the present disclosure may be applied to a mobile device, a video phone, a smart watch, a watch phone, a wearable device, a foldable device, a rollable device, a bendable device, a flexible device, a curved device, an electronic notebook, an e-book, a portable multimedia player (PMP), a personal digital assistant (PDA), MP3 player, a mobile medical device, a desktop PC, a laptop PC, a netbook computer, a workstation, a navigation, a vehicle navigation, a vehicle display, a television, a wallpaper display, a signage device, a game device, a laptop computer, a monitor, a camera, a camcorder, home appliances and the like.

According to an embodiment of the present disclosure, even after manufacturing of the display panel is completed, whether a gate signal is normally output through a gate line provided in the display panel can be monitored, and thus, whether the display panel is defective may be monitored.

According to an embodiment of the present disclosure, even after manufacturing of the display panel is completed, whether the gate driver provided in the display area of the display panel is normally driven can be monitored, and thus, whether the display panel is defective can be determined.

According to an embodiment of the present disclosure, whether the gate driver is normally driven can be monitored through the monitoring pad provided on the rear surface of the display panel, and thus, whether the display panel is defective can be quickly and easily determined.

According to an embodiment of the present disclosure, because a length of the monitoring line may be minimized or reduced, a load of the monitoring line can be minimized or reduced, and thus, whether the display panel is defective can be determined more accurately. That is, as the length of the monitoring line is minimized or reduced, a resistance of the monitoring line can be minimized or reduced, parasitic capacitance generated in the monitoring line can be minimized or reduced, and thus, noise included in the monitoring signal can be minimized or reduced. Accordingly, an accurate analysis of the monitoring signal can be performed.

According to an embodiment of the present disclosure, when a display panel is manufactured by bonding two panels, whether a gate driver is normally driven can be monitored even after the two panels are bonded.

According to an embodiment of the present disclosure, when a display panel is manufactured by connecting the lines provided on the front and rear surfaces of the panel through routing lines provided on a lateral surface, whether the gate driver is normally driven can be monitored even after the routing lines are provided.

According to an embodiment of the present disclosure, because a non-display area in which an image is not displayed can be reduced or removed, the immersion of a user may increase.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
   a display panel in which a plurality of pixels, first to gth gate lines, and a plurality of data lines are provided, g being a natural number; and
   a plurality of link lines provided on a rear surface of the display panel and connected to the plurality of data lines provided on a front surface of the display panel,
   wherein in a display area including the plurality of pixels in the front surface, a first stage to an mth stage generating a plurality of gate signals to be supplied to the first gate line to the gth gate line are provided, m being a natural number less than or equal to g,
   a first monitoring line through which a first monitoring signal is output is connected to the first stage, and
   the first monitoring line extends to the rear surface through a lateral surface of the display panel.

2. The display apparatus of claim 1, wherein a plurality of transistors included in the first stage is dispersed to be provided between a set of the plurality of pixels provided along at least one gate line connected to the first stage.

3. The display apparatus of claim 1, wherein each of the first gate line to the gth gate line extends from one end to the other end of the display panel in a first direction,
   the first monitoring line comprises a first line extending in a second direction different from the first direction, and
   the first line extends to the rear surface through the lateral surface.

4. The display apparatus of claim 3, wherein the first monitoring line further comprises a second line provided between the first stage and the first line,
   the second line is provided along the first direction, and
   a length of the second line is shorter than a length of each of the first gate line to the gth gate line.

5. The display apparatus of claim 1, wherein the first monitoring line is connected to a first monitoring pad provided on the rear surface.

6. The display apparatus of claim 1, wherein the first monitoring line extends in a direction different from a direction of the first gate line to the gth gate line.

7. The display apparatus of claim 1, wherein the first stage is provided at one end of the display area in a second direction different from a first direction in which the gate lines extend.

8. The display apparatus of claim 1, wherein the first stage is connected to the first gate line, and
   the mth stage is connected to the gth gate line.

9. The display apparatus of claim 8, wherein a second monitoring line through which a second monitoring signal is output is connected to the mth stage, and
   the second monitoring line extends to the rear surface through the lateral surface.

10. The display apparatus of claim 9, wherein the first stage is provided at one end of the display area in a second direction different from a first direction in which the gate lines extend, and
    the mth stage is provided at the other end of the display area in the second direction.

11. The display apparatus of claim 9, wherein another monitoring line through which another monitoring signal is output is connected to at least one of the second stage to m−1th stage, and
    the another monitoring line extends to the rear surface through the lateral surface.

12. The display apparatus of claim 1, wherein each of the first to mth stages comprises a buffer connected to at least one of the first to gth gate lines,
    the buffer comprises at least one pull-up transistor outputting a gate pulse and at least one pull-down transistor outputting a gate off signal, and
    the first stage further comprises a first monitoring buffer connected to the first monitoring line.

13. The display apparatus of claim 12, wherein the first monitoring buffer comprises a first monitoring pull-up transistor and a first monitoring pull-down transistor,
    a gate of the first monitoring pull-up transistor is connected to a gate of the at least one pull-up transistor, and
    a gate of the first monitoring pull-down transistor is connected to a gate of the at least one pull-down transistor.

14. The display apparatus of claim 13, wherein a first terminal of the first monitoring pull-up transistor is connected to a monitoring gate clock line to which a monitoring gate clock is supplied,
    a second terminal of the first monitoring pull-up transistor is connected to the first monitoring line,
    a first terminal of the first monitoring pull-down transistor is connected to a monitoring off voltage line to which a gate off voltage corresponding to the gate off signal is supplied, and
    a second terminal of the first monitoring pull-down transistor is connected to the first monitoring line.

15. The display apparatus of claim 12, wherein the buffers included in each of the first stage to the mth stage further comprise a carry transistor sharing a gate with the at least one pull-up transistor, and
- a pulse width of a carry clock supplied to the carry transistor included in the first stage is greater than a pulse width of a carry clock supplied to the carry transistor included in the second stage.

16. The display apparatus of claim 12, wherein the buffers included in each of the first stage to the mth stage further comprise a carry transistor sharing a gate with the at least one pull-up transistor, and
- a pulse width of a carry clock supplied to the carry transistor included in the first stage is the same as a pulse width of a carry clock supplied to the carry transistor included in the second stage.

17. The display apparatus of claim 15, wherein while the carry clock is supplied to the carry transistor included in the first stage, at least one gate clock is supplied to the at least one pull-up transistor and the monitoring gate clock is supplied to the first monitoring buffer.

18. The display apparatus of claim 15, wherein a carry capacitor is connected to one of two terminals of the carry transistor and a gate of the carry transistor.

19. The display apparatus of claim 16, wherein while the carry clock is supplied to the carry transistor included in the first stage, at least one gate clock is supplied to the at least one pull-up transistor and the monitoring gate clock is supplied to the first monitoring buffer.

20. The display apparatus of claim 16, wherein a carry capacitor is connected to one of two terminals of the carry transistor and a gate of the carry transistor.

\* \* \* \* \*